United States Patent [19]

Huggett et al.

[11] 4,368,099
[45] Jan. 11, 1983

[54] DEVELOPMENT OF GERMANIUM SELENIDE PHOTORESIST

[75] Inventors: Paul G. Huggett, Zurich; Klaus Frick, Herrliberg, both of Switzerland

[73] Assignee: RCA Corporation, New York, N.Y.

[21] Appl. No.: 346,180

[22] Filed: Feb. 5, 1982

[51] Int. Cl.³ .................... H01L 21/306; B44C 1/22; C03C 15/00; C03C 25/06
[52] U.S. Cl. ................... 156/628; 156/643; 156/646; 156/659.1; 156/904; 204/192 E; 427/43.1; 430/313; 430/317; 430/434
[58] Field of Search ............... 204/192 E; 427/38, 39, 427/43.1; 156/643, 644, 646, 651, 652, 653, 659.1, 668, 904, 628, 662; 430/270, 313, 316, 317, 318, 434; 148/1.5, 187

[56] References Cited

U.S. PATENT DOCUMENTS

| | | | |
|---|---|---|---|
| 3,707,372 | 12/1972 | Hallman et al. | 96/35 |
| 4,127,414 | 11/1978 | Yoshikawa et al. | 96/67 |
| 4,276,368 | 6/1981 | Heller et al. | 430/321 X |
| 4,320,191 | 3/1982 | Yoshikawa et al. | 156/643 X |
| 4,330,384 | 5/1982 | Okudaira et al. | 156/643 X |

FOREIGN PATENT DOCUMENTS 18653  2/1980  European Pat. Off. .............. 21/225

OTHER PUBLICATIONS

Applied Physics Letters, vol. 29, No. 10, pp. 677–679, 1976 (Yoshikawa et al. II).
Applied Physics Letters, vol. 36, No. 1, pp. 107–109, 1980 (Yoshikawa et al. I).
J. Vac Sci. Technol., vol. 16, No. 6, pp. 1977–1979, 1979 (Tai et al. I).
J. Vac Sci. Technol., vol. 17, No. 5, pp. 1169–1176, 1980 (Tai et al. II).

*Primary Examiner*—William A. Powell
*Attorney, Agent, or Firm*—Birgit E. Morris; R. Hain Swope

[57] ABSTRACT

An improved method of etching a silver-doped germanium selenide resist film utilizing as the etchant gas sulfur hexafluoride.

7 Claims, No Drawings

DEVELOPMENT OF GERMANIUM SELENIDE PHOTORESIST

This invention relates to photoresists comprising germanium selenide and development thereof.

BACKGROUND OF THE INVENTION

The use of inorganic resist materials to produce micron and submicron features in various substrates has been reported in the literature. The successful fabrication of such small features is of prime interest to the electronics industry in its quest for ever-finer resolution for microcircuit applications.

A particular inorganic resist system which has drawn considerable attention is silver sensitized germanium-selenide films. This resist system is formed by coating a film of germanium-selenide with a layer containing a source of silver. The silver layer is then irradiated with light or electron beam through a suitable mask resulting in selected doping of the Ge/Se film with silver by the well-known phenomenon of light-induced silver migration.

The Ge/Se film is then etched to remove the portion not doped with silver, thus leaving the doped film as a mask for further processing of the underlying substrate. Although the undoped portion of the film can be removed by wet etching techniques, it is preferable to develop it by plasma etching using carbon tetrafluoride as the etchant gas. This process yields good contrast and selectivity. The sensitivity of carbon tetrafluoride etching, however, is relatively low, a disadvantage.

In accordance with this invention, a means of etching silver-doped Ge-Se films is provided which substantially improves both sensitivity and contrast and, in addition, significantly improves selectivity in reactive sputter etching.

BRIEF SUMMARY OF THE INVENTION

There is provided an improved method of dry developing a silver-doped germanium-selenide resist utilizing sulfur hexafluoride as the etchant gas.

DETAILED DESCRIPTION OF THE INVENTION

Resist films of germanium-selenide developed in accordance with this invention may be formed on a variety of substrates and may be utilized individually or as part of a multiple-layer resist system.

The selenium-germanium film is formed in a convention manner, for example, by sputtering or vacuum evaporation. Vacuum evaporation techniques are preferred. The film can be from 10 to 25 mole percent germanium and 90 to 75 mole percent selenium. $Ge_{10}Se_{90}$ films are preferred. The thickness of the film is not particularly critical to this invention. Generally, however, films from about 200 nm to about 350 nm are contemplated.

The substrate can be selected from a variety of materials such as silicon, silicon oxide, metals such as aluminum, molybdenum, tungsten, chromium, and their alloys, various plastics and the like. The substrate may be homogeneous or a multi-layered structure. A preferred application of the subject methodology is a bilevel resist system. In such a system, the substrate to be patterned is coated with a layer of plastic such as a polyimide, a novolac resin or the like. The plastic layer serves as a profile smoothing coating for exposure of the GeSe layer and usually functions as the actual etch mask for the underlying substrate.

A significant advantage to the method of this invention is that the GeSe film is reactive sputter etched with sulfur hexafluoride. In contrast, the previously known method of dry development using carbon tetrafluoride has been carried out by plasma etching in a barrel reactor. When the GeSe film is deposited over a layer of polyimide which is etched by reactive sputter etching in oxygen, etching of the bilevel system and the substrate may be carried out sequentially in the same apparatus by merely changing the etchant gas. The advantages of such a procedure in a production mode are readily apparent to one of ordinary skill in the art. This would not be possible using carbon tetrafluoride because of its poor selectivity in reactive sputter etching procedures.

The silver coating on the GeSe films can be formed by conventional techniques. Generally, the substrate is simply immersed in aqueous solution containing a source of silver such as silver nitrate, $(AgNO_3)$. An electroless plating solution of potassium silver cyanide $(KAg(CN)_2)$ may likewise be used. The choice of a particular solution to deposit the silver coating on the GeSe film is not particularly critical to the practice of this invention.

Once the silver layer has been deposited on the GeSe film, a portion is irradiated in accordance with conventional procedures by light or an electron beam. Irradiation with light is preferred. Irradiation causes the silver to diffuse into the GeSe film forming corresponding doped regions. The silver layer in the non-irradiated portion of the film is conventionally removed with an acid solution, e.g. aqua regia or nitric acid, or a potassium iodide/iodine solution, with the latter being preferred.

The GeSe film is then etched in accordance with this invention with sulfur hexafluoride. Although other conventional plasma etching equipment may be utilized, it is particularly preferred in accordance with this invention to develop the doped GeSe film by reactive sputter etching. The conditions under which the reactive sputter etching of the GeSe film is carried out are not critical and may vary within rather wide ranges. Generally, sulfur hexafluoride gas is introduced into the reaction chamber at from about 20 about 50 scc/min, preferably about 30 scc/min. The pressure is generally from about 7.5 to about 25 mTorr, preferably about 10 mTorr. The rf power is preferably about 150 watts with a substrate table diameter of 400 millimeters.

The method of etching silver-doped GeSe films in accordance with this invention is advantageous in comparison to the previously used etchant gas carbon tetrafluoride in terms of sensitivity, contrast and particularly selectivity in reactive sputter etching. Sensitivity may be defined as the energy input in $mJ/cm^2$ required to develop a film with a 50 percent normalized film thickness remaining. Contrast is defined as the slope of a curve obtained by plotting percent film remaining against logarithm exposure dose. Selectivity, as utilized herein, is defined as the ratio of the etch rate of the silver-doped portion of Ge/Se film vs. the etch rate of the undoped portion. Those values for the subject method are at least twice those of carbon tetrafluoride under its optimized conditions, i.e. plasma etch conditions in a barrel reactor. The contrast, $\gamma$, of 7.5 and selectivity of better than 50:1 for the method of this invention are particularly outstanding.

Although the exact mechanism responsible for the highly advantageous values given above is not known, it is believed that, in the method of this invention, a layer of silver sulfide is formed on the surface of the doped portion of the film. The protecting capacity of this layer can be demonstrated by exposing a silver-doped GeSe film to a sulfur hexafluoride plasma for a few seconds and then developing it in a carbon tetrafluoride plasma. The selectivity of a film developed in this manner is that of sulfur hexafluoride (>50:1) as opposed to that characteristic of carbon tetrafluoride (1.8:1). This indicates that a protective layer, believed to be silver sulfide, is rapidly formed and remains throughout the etching process, regardless of which etchant gas is utilized. An attempt to form such a protecting layer by exposure to a hydrogen sulfide gas plasma prior to carbon tetrafluoride etching produced no change in the etch conditions.

The following examples further illustrate this invention, it being understood that the invention is in no way intended to be limited to the details described therein. In the Examples all parts and percentages are on a weight basis and all temperatures are in degrees Celsius unless otherwise stated.

EXAMPLE 1

A 300 nm thick film of $Ge_{10}Se_{90}$ was formed by flash evaporation onto a 1 $\mu$m thick layer of polyimide (XU-218 available from Ciba-Geigy) on 5×5 cm glass plates. The plates were dipped in a 0.25 molar solution of potassium silver cyanide for 30 seconds, rinsed in deionized water and spun dry under nitrogen. The plates were then irradiated with a 1,000 W Xe-Hg lamp having a 436 nm interference filter for 200 seconds through a quartz step wedge of 3.1, 4.7, 6.3, 9.4, 12.5, 17.1, 25.0, 34.3, 50.0, 68.8 and 100 percent transmission. The plates were then dipped in an aqueous solution of iodine (0.03 molar) and potassium iodide (2.0 molar) to remove any excess silver from the surface of the film.

Samples of the plates were etched in a commercial sputter etching reactor having a quartz plate as the lower electrode with a diameter of 400 millimeters. Sulfur hexafluoride was introduced into the reactor at about 30 scc/min. and the pressure in the reactor was maintained at about 10 mTorr. The power applied was 150 watts.

The $Ge_{10}Se_{90}$ film was cleanly etched at a high etch rate of 9,000–12,000 angstroms per minute. The selectivity, i.e. the rate of etch of unirradiated vs. irradiated film, was better than 50:1. A sensitivity curve was plotted and sensitivity was determined to be 40–50 mJ/cm$^2$. Contrast, $\gamma$, was determined to be 7.5.

COMPARATIVE EXAMPLES

Films prepared in accordance with Example 1 were sputter etched under similar conditions utilizing carbon tetrafluoride as the etchant gas. The sensitivity of 90 mJ/cm$^2$ and the contrast, $\gamma$, of 1.7 are poor and the selectivity of only 1.8:1 is considered unacceptable.

In an experiment described in Applied Physics Letters, Vol. 38, No. 1 pp. 107–109 (1980), similar plates were etched in a conventional barrel-type plasma etching machine utilizing carbon tetrafluoride as the etchant gas. The pressure was 0.5 Torr and rf power was 100 watts. Sensitivity was 90 mJ/cm$^2$, contrast, $\gamma$ was 4.5 and selectivity was 370:1.

EXAMPLE 2

Substrates comprising silicon wafers having a 0.5 micrometer thick coating of silicon dioxide were coated with polyimide in accordance with Example 1. The polyimide layer was coated with a $Ge_{10}Se_{90}$ film which was irradiated and developed in accordance with Example 1.

Etching was carried out utilizing sulfur hexafluoride in a commercial sputter reactor in accordance with Example 1. When etching of the GeSe film was completed, the etchant gas was changed to oxygen, pressure of 20 mTorr and rf power of 100 watts. The polyimide was anisotropically etched at about 1,000 angstroms per minute utilizing the GeSe film as an etch mask. There was no measurable etching of the GeSe film.

We claim:

1. In a method of forming a pattern in a resist layer of germanium selenide on a substrate comprising:
   (a) coating the germanium selenide layer with a photosensitive silver-containing material;
   (b) irradiating a portion of the silver-containing coating to provide a corresponding silver-doped portion of the germanium selenide layer;
   (c) removing the non-irradiated portion of the silver-containing coating; and
   (d) plasma etching the germanium selenide layer with an etchant gas to remove that portion not doped with silver,
   the improvement comprising utilizing as the etchant gas in step (d) sulfur hexafluoride.

2. A method in accordance with claim 1, wherein said germanium selenide layer is etched by reactive sputter etching with sulfur hexafluoride.

3. A method in accordance with claim 1, wherein said germanium selenide layer is comprised of about 10 mole percent germanium and about 90 mole percent selenium.

4. A method in accordance with claim 1, wherein said silver-containing material is potassium silver cyanide.

5. A method in accordance with claim 1, wherein said substrate is comprised of a plurality of layers and the layer having the germanium selenide disposed thereon is polyimide, the improvement further comprising reactive sputter etching a portion of the polyimide layer utilizing oxygen as the etchant gas and the patterned germanium selenide layer as a mask.

6. A method in accordance with claim 5, wherein the etching procedures are carried out sequentially in the same apparatus.

7. A method in accordance with claim 5, wherein the polyimide is disposed on a layer of a metal.

* * * * *